United States Patent
Lopatin et al.

(10) Patent No.: US 7,696,092 B2
(45) Date of Patent: Apr. 13, 2010

(54) METHOD OF USING TERNARY COPPER ALLOY TO OBTAIN A LOW RESISTANCE AND LARGE GRAIN SIZE INTERCONNECT

(75) Inventors: Sergey D. Lopatin, Santa Clara, CA (US); Paul R. Besser, Sunnyvale, CA (US); Pin-Chin Connie Wang, Menlo Park, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 100 days.

(21) Appl. No.: 09/994,395

(22) Filed: Nov. 26, 2001

(65) Prior Publication Data

US 2004/0005773 A1    Jan. 8, 2004

(51) Int. Cl.
*H01L 21/44* (2006.01)
*H01L 23/48* (2006.01)

(52) U.S. Cl. .............. 438/687; 438/653; 438/654; 438/658; 438/675; 257/762; 257/767

(58) Field of Classification Search .......... 438/660, 438/675, 678, 658, 652–654, 643, 687, 691, 438/670, 762, 748–750; 257/741, 748, 750, 257/762, 758, 767, 774
See application file for complete search history.

(56) References Cited

U.S. PATENT DOCUMENTS

| | | | |
|---|---|---|---|
| 5,004,520 A * | 4/1991 | Tsuji et al. ............... | 156/630 |
| 5,224,520 A | 7/1993 | Shinbara et al. | |
| 5,243,222 A * | 9/1993 | Harper et al. ............. | 257/774 |
| 5,300,462 A | 4/1994 | Kakumu ................... | 437/195 |
| 5,552,341 A | 9/1996 | Lee ......................... | 437/192 |
| 5,654,245 A | 8/1997 | Allen ...................... | 438/629 |
| 5,770,517 A | 6/1998 | Gardner et al. ........... | 438/627 |
| 5,821,168 A | 10/1998 | Jain ........................ | 438/692 |
| 5,882,738 A | 3/1999 | Blish, II et al. .......... | 427/526 |
| 5,899,740 A | 5/1999 | Kwon ...................... | 438/627 |
| 5,969,422 A | 10/1999 | Ting et al. ................ | 257/762 |
| 6,015,749 A | 1/2000 | Liu et al. ................. | 438/628 |

(Continued)

FOREIGN PATENT DOCUMENTS

EP    0567867    4/1993

(Continued)

OTHER PUBLICATIONS

James A. Cunningham, "Improving Copper Interconnects: A Search for Useful Dopants," Semiconductor International, (Apr. 2000), pp. 1-8.*

(Continued)

*Primary Examiner*—Ori Nadav
(74) *Attorney, Agent, or Firm*—Ditthavong, Mori & Steiner, P.C.

(57) ABSTRACT

A method of fabricating an integrated circuit includes forming a barrier layer along lateral side walls and a bottom of a via aperture and providing a ternary copper alloy via material in the via aperture to form a via. The via aperture is configured to receive the ternary copper alloy via material and electrically connect a first conductive layer and a second conductive layer. The ternary copper alloy via material helps the via to have a lower resistance and an increased grain size with staffed grain boundaries.

19 Claims, 9 Drawing Sheets

U.S. PATENT DOCUMENTS

| | | | |
|---|---|---|---|
| 6,030,895 A * | 2/2000 | Joshi et al. | 438/679 |
| 6,069,068 A | 5/2000 | Rathore et al. | 438/628 |
| 6,090,710 A * | 7/2000 | Andricacos et al. | 438/687 |
| 6,096,648 A | 8/2000 | Lopatin et al. | 438/687 |
| 6,117,770 A | 9/2000 | Pramanick et al. | 438/659 |
| 6,156,638 A | 12/2000 | Agarwal et al. | 438/627 |
| 6,159,845 A * | 12/2000 | Yew et al. | 438/637 |
| 6,180,522 B1 | 1/2001 | Hong | 438/659 |
| 6,225,221 B1 | 5/2001 | Ho et al. | 438/678 |
| 6,242,808 B1 | 6/2001 | Shimizu et al. | |
| 6,268,291 B1 | 7/2001 | Andricacos et al. | 438/694 |
| 6,294,463 B1 | 9/2001 | Tseng | |
| 6,294,836 B1 | 9/2001 | Paranjpe et al. | |
| 6,297,146 B1 | 10/2001 | Lopatin | 438/625 |
| 6,344,413 B1 | 2/2002 | Zurcher et al. | 438/678 |
| 6,365,502 B1 | 4/2002 | Paranjpe et al. | 438/622 |
| 6,380,083 B1 * | 4/2002 | Gross | 438/687 |
| 6,399,496 B1 * | 6/2002 | Edelstein et al. | 438/687 |
| 6,410,383 B1 | 6/2002 | Ma | 438/247 |
| 6,420,262 B1 | 7/2002 | Farrar | 438/652 |
| 6,423,633 B1 | 7/2002 | Tseng | |
| 6,426,289 B1 | 7/2002 | Farrar | 438/670 |
| 6,440,849 B1 * | 8/2002 | Merchant et al. | 438/658 |
| 6,461,675 B2 | 10/2002 | Paranjpe et al. | 427/250 |
| 6,465,867 B1 | 10/2002 | Bernard et al. | |
| 6,482,734 B1 | 11/2002 | Ha et al. | |
| 6,482,740 B2 * | 11/2002 | Soininen et al. | 438/686 |
| 6,500,749 B1 | 12/2002 | Liu et al. | |
| 6,521,532 B1 | 2/2003 | Cunningham | 438/687 |
| 6,534,865 B1 | 3/2003 | Lopatin et al. | 257/751 |
| 6,749,699 B2 * | 6/2004 | Bogel et al. | 148/432 |
| 2001/0035237 A1 | 11/2001 | Nagano et al. | |
| 2002/0036309 A1 | 3/2002 | Sekiguchi et al. | 257/301 |
| 2002/0039542 A1 * | 4/2002 | Bogel et al. | 420/492 |
| 2002/0053741 A1 | 5/2002 | Iwasaki et al. | 257/762 |
| 2002/0084529 A1 | 7/2002 | Dubin et al. | 257/774 |
| 2002/0102838 A1 | 8/2002 | Paranjpe et al. | 438/622 |
| 2002/0109233 A1 | 8/2002 | Farrar | 257/762 |
| 2002/0115292 A1 | 8/2002 | Andricacos et al. | 438/687 |
| 2002/0137332 A1 | 9/2002 | Paranjpe et al. | 438/637 |

FOREIGN PATENT DOCUMENTS

| | | |
|---|---|---|
| EP | 0 567 867 A2 | 11/1993 |
| EP | 1039531 | 3/2000 |
| EP | 1 039 531 A2 | 9/2000 |
| EP | 1094515 | 10/2000 |
| EP | 1 039 531 A3 | 12/2000 |
| EP | 1 094 515 A2 | 4/2001 |
| WO | WO 03/046979 A2 | 6/2003 |

OTHER PUBLICATIONS

Dong Joon Kim et al, "New Method to Prepare W-B$^+$-N Ternary Barrier to Cu diffusion by Implanting BF$_2$$^+$Ions Into W-N Thin Film," J. Vac. Sci. Technol. B 17(4), Jul./Aug. 1999, pp. 1598-1601.

W. F. McArthur et al., "Structural and Electrical Characterization of Si-Implanted Tin as a Diffusion Barrier for Cu Metallization," Mat. Res. Soc. Symp. Proc. vol. 391, 1995, pp. 327-332.

PCT International search Report, International Application No. PCT/US 02/32554, International Filing Date Nov. 10, 2002 (5 pages).

PCT International Search Report, International Application No. PCT/US 02/32605, International Filing Date Nov. 10, 2002 (7 pages).

Internet World Wide Web page, www.timken.com/timken_ols/steel/handbook/glossary.asp, printed Jul. 28, 2006.

Internet World Wide Web page, www.key-to-metals.com/Article75.htm, printed Jul. 28, 2006.

Internet World Wide Web page, www.springerlink.com/(oxxzaljibpxfik55uulzh145)/app/home/contribution.asp?referrer=default, printed Aug. 2, 2006.

Internet World Wide Web page, www.springerlink.com/(w4sbs3yfnzlnbk45rfzvqb45)/app/home/contribution.asp?referrer=default, printed Aug. 2, 2006.

Internet World Wide Web page, www.keytosteel.com/de/ViewArticle.asp?ID=62, printed Aug. 2, 2006.

Internet World Wide Web page, http://industryarticles.wordpress.com/tag/aluminum/, printed Aug. 2, 2006.

Written Opinion for International Patent Application No. PCT/US2002/32605, mailed Mar. 22, 2004, 5 pages.

* cited by examiner

METHOD OF USING TERNARY COPPER ALLOY TO OBTAIN A LOW RESISTANCE AND LARGE GRAIN SIZE INTERCONNECT

CROSS REFERENCE TO RELATED APPLICATIONS

This application is related to U.S. patent application Ser. No. 10/123,751, entitled USE OF ULTRA-LOW ENERGY ION IMPLANTATION (ULEII) TO FORM ALLOY LAYERS IN COPPER; U.S. patent application Ser. No. 09/994,400, entitled METHOD OF INSERTING ALLOY ELEMENTS TO REDUCE COPPER DIFFUSION AND BULK DIFFUSION; and U.S. patent application Ser. No. 09/994,397, entitled METHOD OF IMPLANTING COPPER BARRIER MATERIAL TO IMPROVE ELECTRICAL PERFORMANCE which are all assigned to the same assignee as this application.

FIELD OF THE INVENTION

The present invention relates generally to integrated circuits and methods of manufacturing integrated circuits. More particularly, the present invention relates to a method of using ternary copper alloy to obtain a low resistance and large grain size interconnect.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of vias (or pathways between integrated circuit layers used to electrically connect separate conductive layers) decreases, electrical resistance increases.

Conventional integrated circuits utilize vias to connect structures (e.g., gates, drain regions, source regions) and conductive lines. A via is typically a metal plug which extends through an insulative layer. A barrier layer is used to protect the via from metal diffusion and from electromigration (EM). The barrier layer can contribute significantly to resistance associated with the via metal. Electromigration is the mass transport due to momentum exchange between conducting electrons and diffusing metal atoms. Electromigration causes progressive damage to the metal conductors in an integrated circuit. In general, it is characteristic of metals at very high current density and temperatures of 100° C. or more.

Integrated circuit manufacturers have attempted to reduce via resistance as the via size decreases by reducing the thickness of the barrier material. According to one conventional process, plasma vapor deposition (PVD), IC manufacturers deposit a very thin barrier material at the bottom of the via due to non-conformed deposition. The thickness of the barrier material is reduced by chemical vapor deposition (CVD) or atomic layer deposition (ALD) processes. These advanced deposition processes form hightly conformed barrier metal films. However, reducing the barrier thickness causes the barrier to become more permeable to copper (Cu) diffusion, which can adversely affect resistance to electromigration.

Figure 1A:
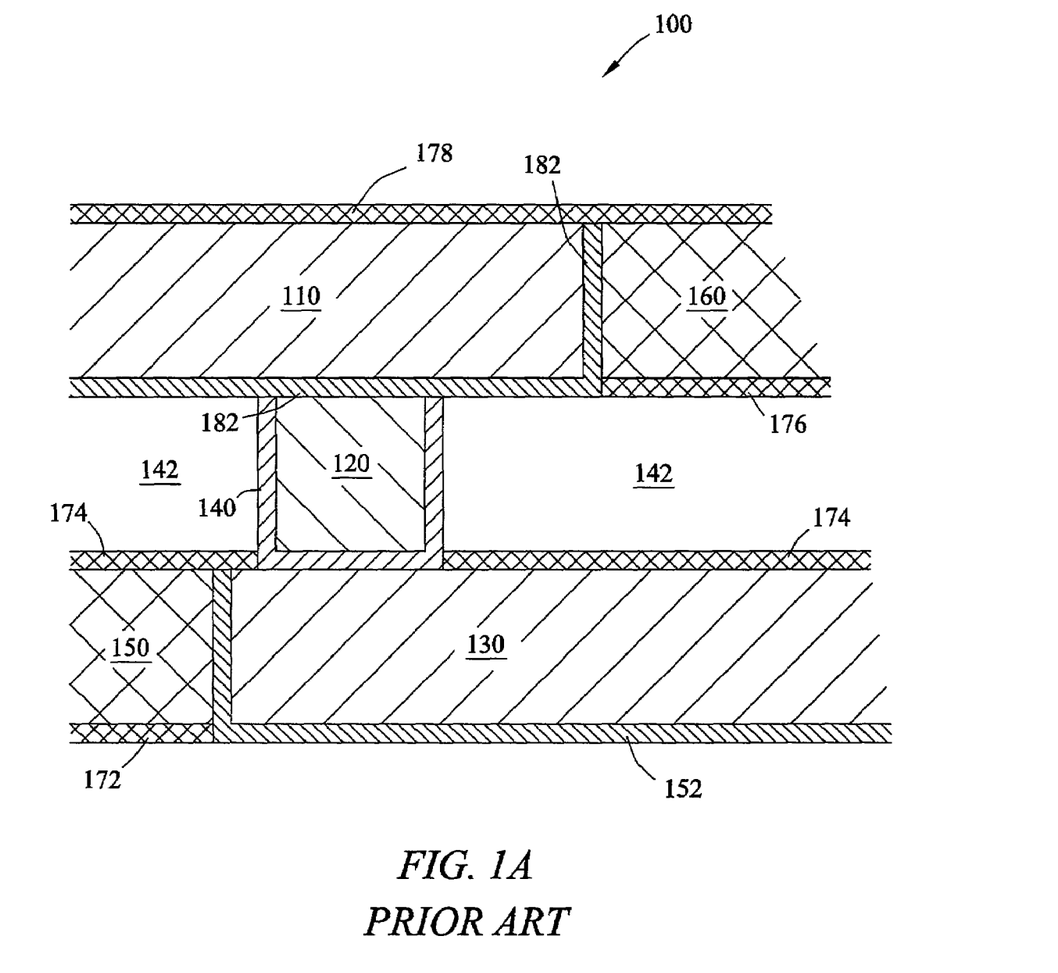
FIG. 1A is a schematic cross-sectional view representation of a single damascene portion of an integrated circuit fabricated in accordance with prior art.
Figure 1B:
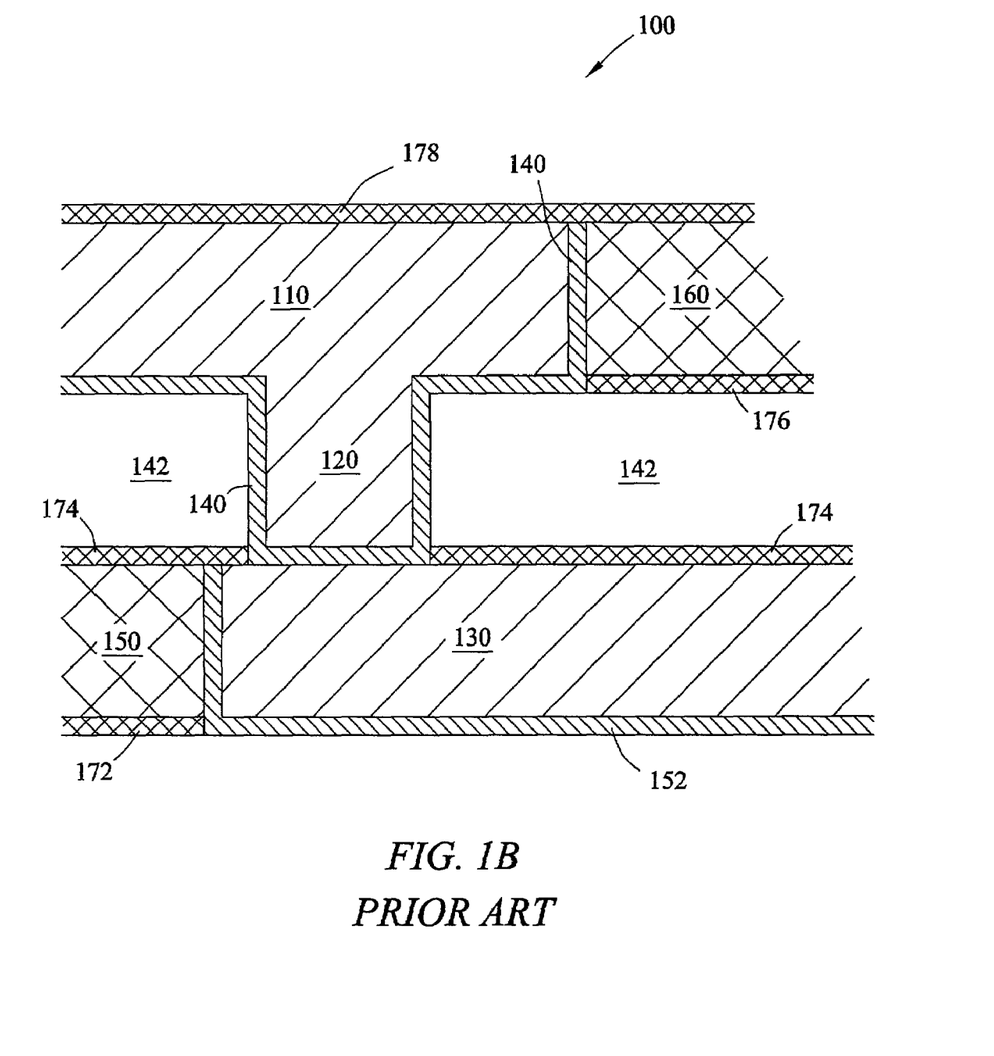
FIG. 1B is a schematic cross-sectional view representation of a dual damascene portion of an integrated circuit fabricated in accordance with prior art.

FIGS. 1A and 1B illustrate a schematic cross-sectional view of a portion 100 of an integrated circuit including a copper layer 110, a copper via 120, a copper layer 130, a dielectric layer 150, and a dielectric layer 160. Via 120 and copper layer 130 are separated by a barrier layer 140.

Portion 100 also includes a dielectric layer 142 that is separated from copper layer 130 by an etch stop layer 174. Dielectric layer 142 can be oxide and etch stop layer 174 can be Silicon Nitride (SiN). Etch stop layer 174 prevents diffusion of copper from copper layer 130 into dielectric layer 142. Dielectric layer 150 can be separated from copper layer 130 by a barrier layer 152. Similarly, dielectric layer 160 can be separated from copper layer 110 by a barrier layer 182. Barrier layers 152 and 182 can be Tantalum Nitride (TaN). Etch stop layers 172, 174, 176, and 178 can be Silicon Nitride (SiN).

According to conventional processes, barrier layer 140 can have a cross-sectional thickness of between 7 nm to 25 nm. Barrier layer 140 inhibits diffusion of copper ions from layers into via 120 and from via into dielectric layer 142. Conventional barrier layers can include Tantalum Nitride (TaN).

FIG. 1A shows a portion formed according to a single damascene process where copper layer 110 and copper via 120 are deposited in two separate steps and are separated by a barrier section 182. FIG. 1B shows a portion formed according to a dual damascene process where copper layer 110 and copper via 120 are deposited in one step or process and are not separated by a barrier.

Figure 2A:
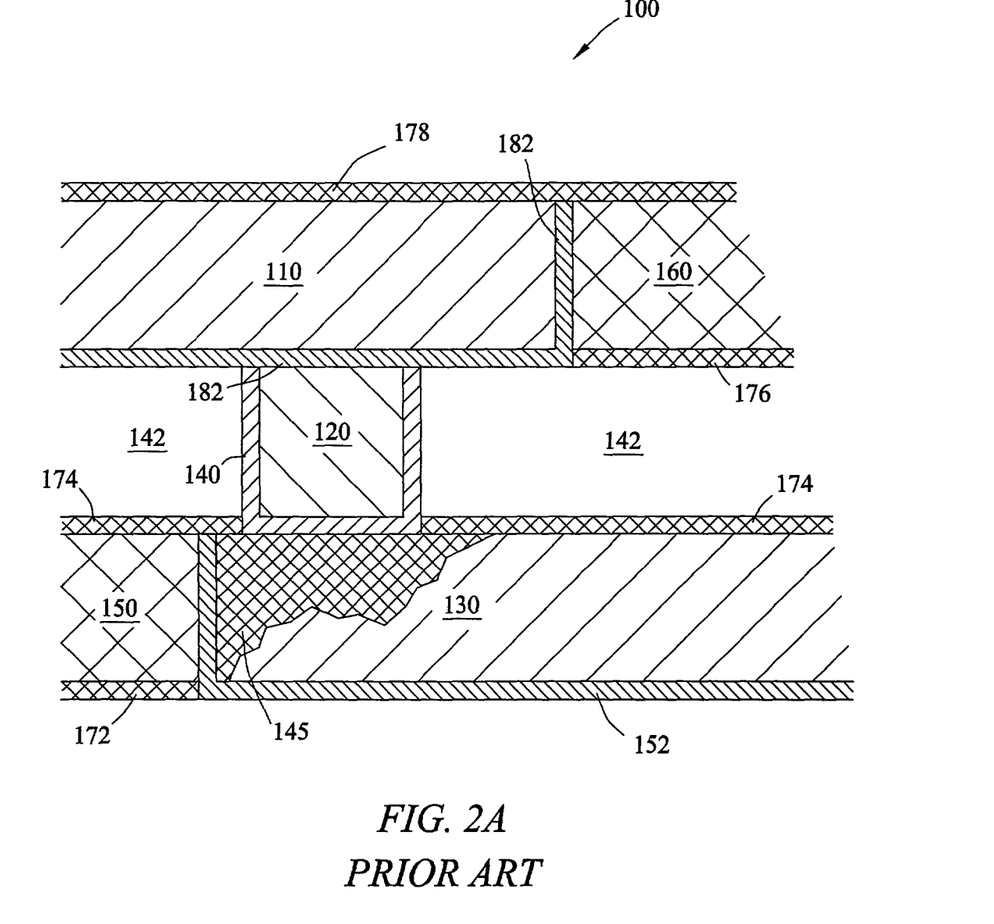
FIG. 2A is a schematic cross-sectional view representation of the single portion of the integrated circuit illustrated in FIG. 1A, showing an electromigration failure.
Figure 2B:
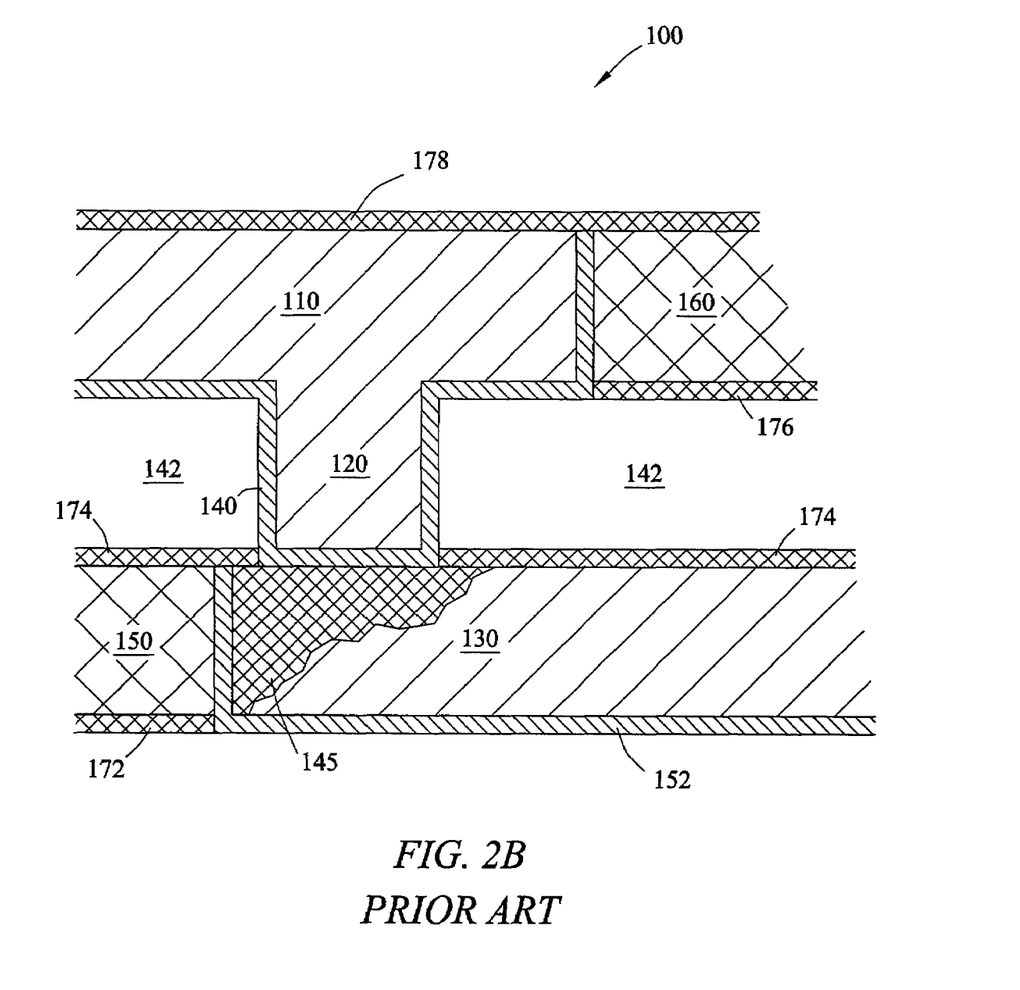
FIG. 2B is a schematic cross-sectional view representation of the dual portion of the integrated circuit illustrated in FIG. 1B, showing an electromigration failure.

As discussed above, conventional systems have attempted to reduce the thickness of barrier layer 140 to reduce the resistance associated with via 120. However, this reduction in thickness can cause electromigration failures. FIGS. 2A and 2B illustrate portion 100 described with reference to FIGS. 1A and 1B, further having an EM failure or void 145 in copper layer 130. FIG. 2A shows a portion formed according to a single damascene process (as described with reference to FIG. 1A) where copper layer 110 and copper via 120 are formed in two separate steps or processes. FIG. 2B shows a portion formed according to a dual damascene process (as described with reference to FIG. 1B) where copper layer 110 and copper via 120 are formed in one step or process.

Figure 3A:
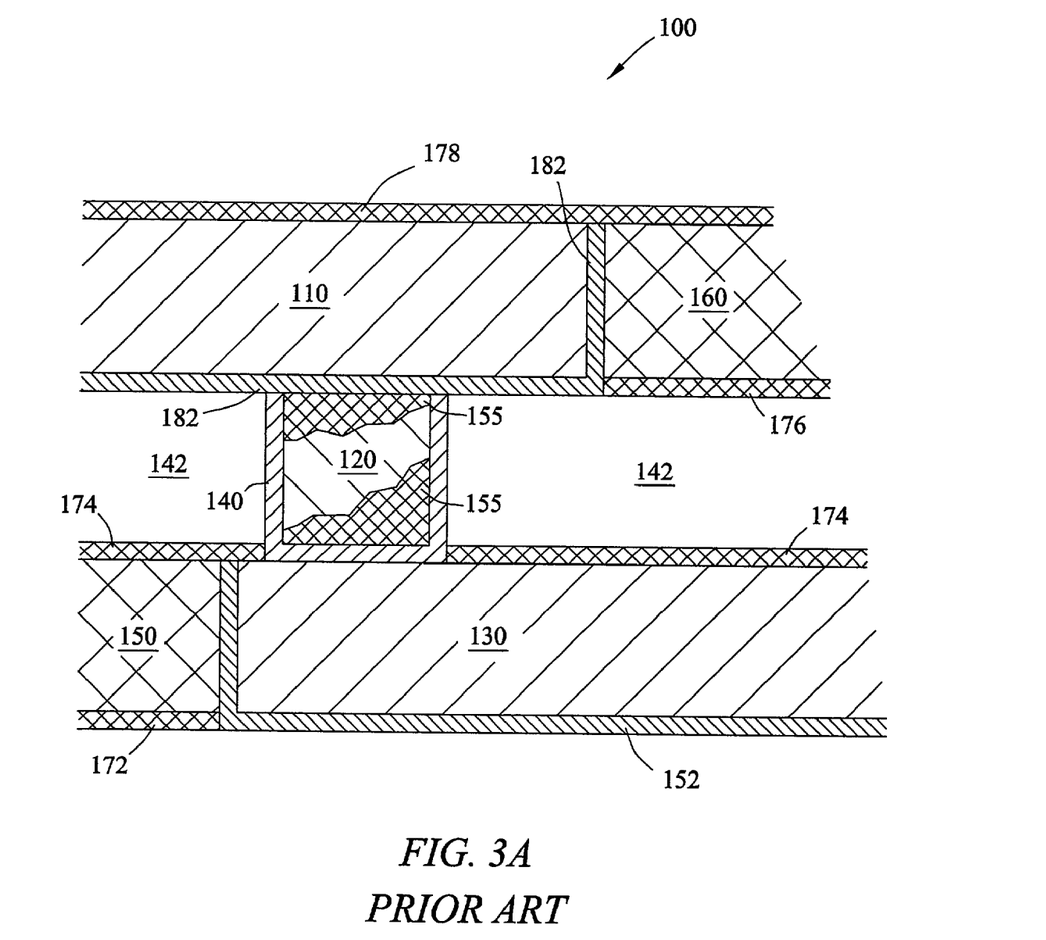
FIG. 3A is a schematic cross-sectional view representation of the single damascene portion of the integrated circuit illustrated in FIG. 1A, showing an electromigration failure.
Figure 3B:
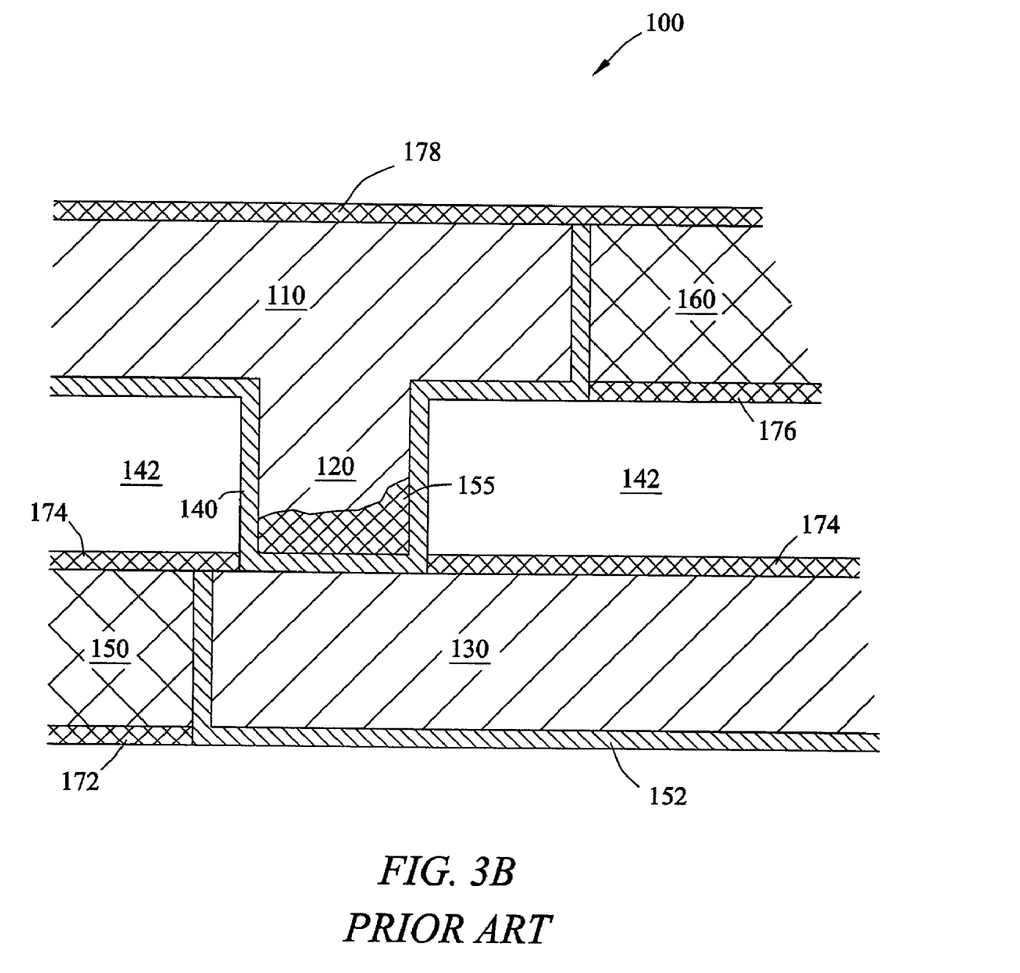
FIG. 3B is a schematic cross-sectional view representation of the dual damascene portion of the integrated circuit illustrated in FIG. 1B, showing an electromigration failure.

FIGS. 3A and 3B illustrate portion 100 having an EM failure or void 155 in via 120 due to copper diffusion from copper via layer 120. FIG. 3A shows a portion formed according to a single damascene process (as described with reference to FIG. 1A) where copper layer 110 and copper via 120 are formed in two separate steps or processes. FIG. 3B shows a portion formed according to a dual damascene process (as described with reference to FIG. 1B) where copper layer 110 and copper via 120 are formed in one step or process.

EM failures have been described by Stanley Wolf, Ph.D. in *Silicon Processing for the VLSI Era*, Lattice Press, Sunset Beach, Calif., Vol. 2, pp. 264-65 (1990). Dr. Wolf explains that a positive divergence of the motion of the ions of a conductor leads to an accumulation of vacancies, forming a void in the metal. Such voids may ultimately grow to a size that results in open-circuit failure of the conductor line.

Thus, there is a need for an interconnect or via having less resistance while not experiencing electromigration in via or line failures. Further, there is a need for a method of forming a large grain size interconnect having stuffed grain boundaries for high electromigration reliability. Even further, there is a need for a method of using ternary copper alloy to obtain a low resistance and large grain size interconnect.

SUMMARY OF THE INVENTION

An exemplary embodiment is related to a method of fabricating an integrated circuit. This method can include forming a barrier layer along lateral side walls and a bottom of a via aperture and providing a ternary copper alloy via material in the via aperture to form a via. The via aperture is configured to receive the ternary copper alloy via material and electrically connect a first conductive layer and a second conductive layer. The ternary copper alloy via material helps the via have a lower resistance and an increased grain size.

Another exemplary embodiment is related to a method of using ternary copper alloy to obtain a low resistance and large grain size interconnect or via. This method can include providing a first conductive layer over an integrated circuit substrate, providing a conformal layer section at a bottom and sides of a via aperture positioned over the first conductive layer to form a barrier separating the via aperture from the first conductive layer, filling the via aperture with a ternary copper alloy via material to form a ternary copper alloy via, and providing a second conductive layer over the ternary copper alloy via such that the ternary copper alloy via electrically connects the first conductive layer to the second conductive layer.

Another exemplary embodiment is related to a method of forming a via in an integrated circuit. This method can include depositing a first conductive layer, depositing an etch stop layer over the first conductive layer, depositing an insulating layer over the etch stop layer, forming an aperture in the insulating layer and the etch stop layer, providing a barrier material at a bottom and sides of the aperture to form a barrier layer, filling the aperture with a ternary copper alloy via material to form a ternary copper alloy via, and providing a second conductive layer over the ternary copper alloy via such that the ternary copper alloy via electrically connects the first conductive layer and the second conductive layer.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 4:
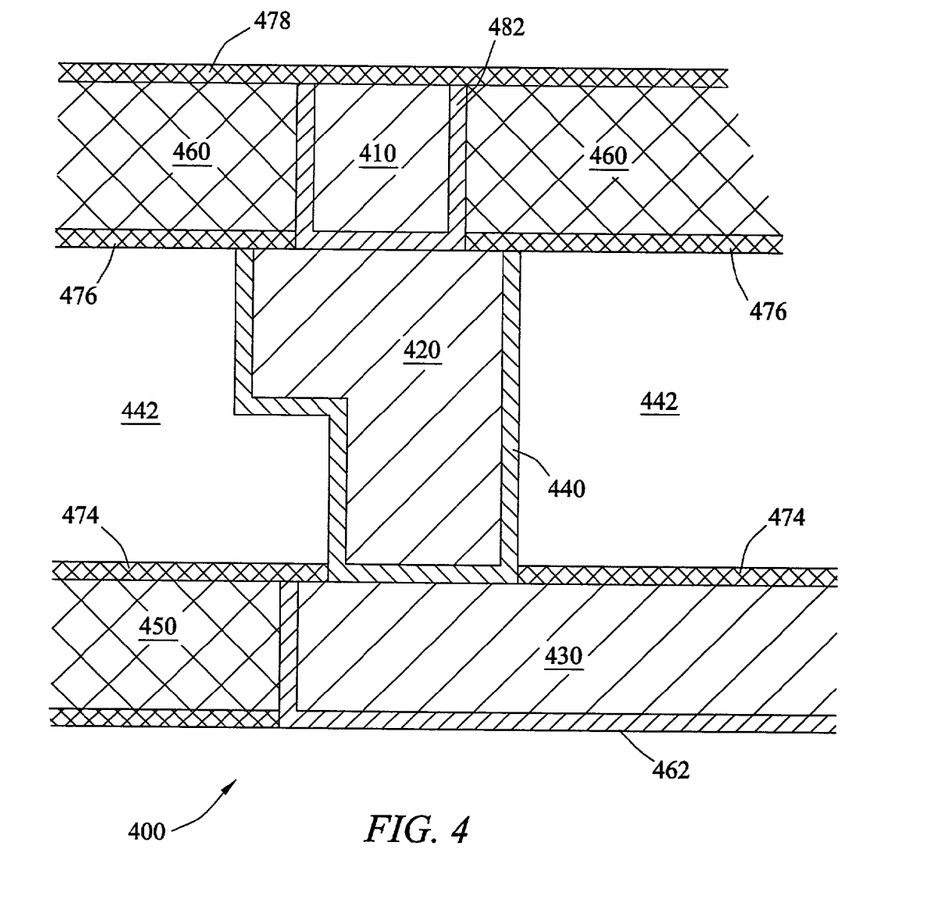
FIG. 4 is a schematic cross-sectional view representation of a portion of an integrated circuit, showing a ternary copper alloy interconnect in accordance with an exemplary embodiment.

With reference to FIG. 4, a schematic cross-sectional view representation of a portion 400 of an integrated circuit includes a conductive via layer 410, a conductive layer and via section 420, a conductive layer 430, a barrier layer 440, a dielectric layer 450, and a dielectric layer 460. Portion 400 is preferably part of an ultra-large-scale integrated circuit having millions or more transistors. Portion 400 is manufactured as part of the IC on a semiconductor wafer, such as, a silicon wafer.

Portion 400 can also include a dielectric layer 442 that is separated from conductive layer 430 by an etch stop layer 474. In an exemplary embodiment, dielectric layer 442 is an oxide material and etch stop layer 474 is Silicon Nitride ($Si_3N_4$) or other suitable material. Etch stop layer 474 prevents diffusion of materials from conductive layer 430 into dielectric layer 442. Conductive via layer 410 can be a layer of any conductive material, such as, copper or another metal.

Dielectric layer 450 can be separated from copper layer 430 by a barrier layer 452. Similarly, dielectric layer 460 can be separated by copper layer 410 by a barrier layer 482. Barrier layers 452 and 462 can be Tantalum Nitride (TaN). Etch stop layers 472, 474, 476, and 478 can be Silicon Nitride (SiN).

Conductive layer and via section 420 can be made of a conductive material and serves to electrically connect conductive layer 410 and conductive layer 430. Conductive layer and via section 420 can include a ternary copper (Cu) alloy, Cu—X—Y. X can be any of a variety of elements with a characteristic of lowering resistance, such as, Zinc (Zn), Silver (Ag), or Tin (Sn). Y can be any of a variety of elements with a characteristic of increasing grain size, such as, Calcium (Ca) or Chromium (Cr).

Advantageously, the ternary copper alloy of via section 420 provides a low resistance interconnect or via, large grain size interconnect, and stuffed grain boundaries. Large grain size promote electromigration reliability because the crystal structure interferes with the mobility of the copper ions. Large grain size also provides lower interconnect resistance. Stuffed grain boundaries increase electromigration reliability because of reduction or restriction of Cu diffusion pathways along grain boundaries.

The material of conductive layer and via section 420 can be deposited using ECD (electrochemical deposition)—either electroless and/or electroplating. A seed layer for the electrochemical deposition can be formed by ALD/CVD (atomic layer deposition/chemical vapor deposition) and/or PVD/IMP (plasma vapor deposition/ion metal plasma), SIP (selfionizing plasma). As an example, the ternary copper alloy of Cu—X—Y can be Cu—Sn—Cr where Tin (Sn) is less than 1 atomic % and Chromium (Cr) is less than 1 atomic %. As another example, Cu—X—Y can be Cu—Zn—Cr where Zinc (Zn) is less than 1 atomic % and Chromium (Cr) is less than 1 atomic %. In the case of Cu—Zn—Cr, the reduced resistance can be 1.8-2.2 $\mu\Omega$ cm and the increased grain size can be 0.5-3 $\mu$m.

An electroplating solution for Cu—Zn—Cr alloy deposition can include Cu salt as a Cu ion source, Zn salt as a Zn ion source, Cr salt as a Cr ion source, complexing agents for metallic ions, pH adjuster, and organic additives. Concentrational ratios of the metallic ions in solution are optimized to form Cu—Zn—Cr films with less than 1 atomic % of Zn and Cr in the alloy film. Complexing agents can be selected from the group of ethylenediamine, ethylenediaminetetraacetic acid, and tartaric acid. Organic additives are selected from the group of polypropylene glycoles, polyethylene glycoles and mercaptan disulfides providing favorable conditions for shape evolution in via/trench area to complete Cu—Zn—Cr fill and to form conductive via layer without voids.

Anneal of electroplated Cu—Zn—Cr layer can be performed to complete recrystallization process further resulting in increased grain size and lowered resistance.

Chemical mechanical polishing, chemical polishing and/or electropolishing can be used to remove Cu—Zn—Cr and barrier layer from the dielectric forming planar surface ready for the next dielectric layer deposition.

Conductive layer 430 can be a layer of copper positioned in proximate location to via section 420. Conductive layer 430 can include an alloy including copper (Cu). In an alternative embodiment, conductive layer 430 is a stack of several layers.

Barrier layer 440 can be Tantalum (Ta), Tantalum Nitride (TaN) Titanium Nitride (TiN), Titanium Silicon Nitride (Ti-SiN), Tungsten Nitride (WNx), or other suitable material. In an exemplary embodiment, barrier layer 440 has a cross-sectional thickness of 5-10 nm. In other embodiments, barrier layer 440 can have dimensions as small as 2-5 nm.

In an exemplary dual damascene method of fabricating portion 400, once conductive layer 430 is deposited, etch stop layer 474 is deposited over conductive layer 430 and dielectric layer 442 is deposited over etch stop layer 442. A resist layer is deposited over dielectric layer 442 and is used in the patterning and etching of an aperture in dielectric layer 442 and etch stop layer 474 in the formation of via section 420. In an exemplary embodiment where via and trench sections have two different widths, two different resist layers can be used in a two step via/trench formation process. The resist layer or layers are removed before depositing via/trench material in conductive layer and via section 420. Conductive via layer 410 is formed to electrically connect conductive layer 420.

Figure 5:
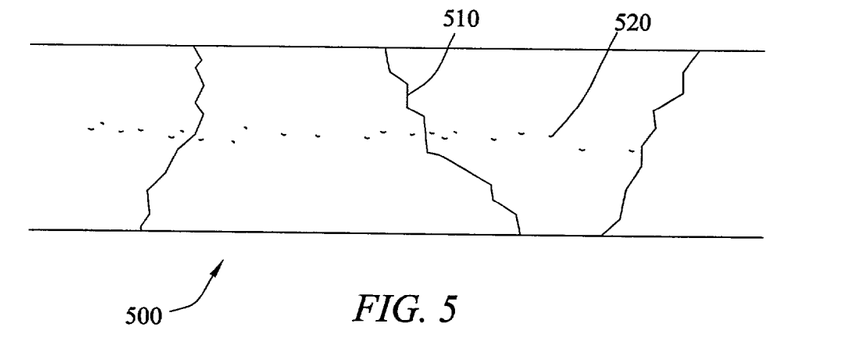
FIG. 5 is a top cross-sectional view representation of a portion of an integrated circuit, showing a ternary copper allow interconnect structure in accordance with another exemplary embodiment.

Referring to FIG. 5, a portion 500 of an integrated circuit includes a dual damascene via/trench section having a ternary copper alloy. Via/trench section can include increased grain sizes 520, reduced resistance and stuffed grain boundaries 510 due to the addition of Tin (Sn) and Chromium (Cr). With increased grain, size, stuffed grain boundaries 510 and reduced resistance, via/trench section can have improved electromigration reliability. As described with respect to FIG. 4, a variety of different techniques can be employed to include elements that lower resistivity and elements that increase grain size. A variety of different elements and combinations of elements can also be used.

Figure 6:
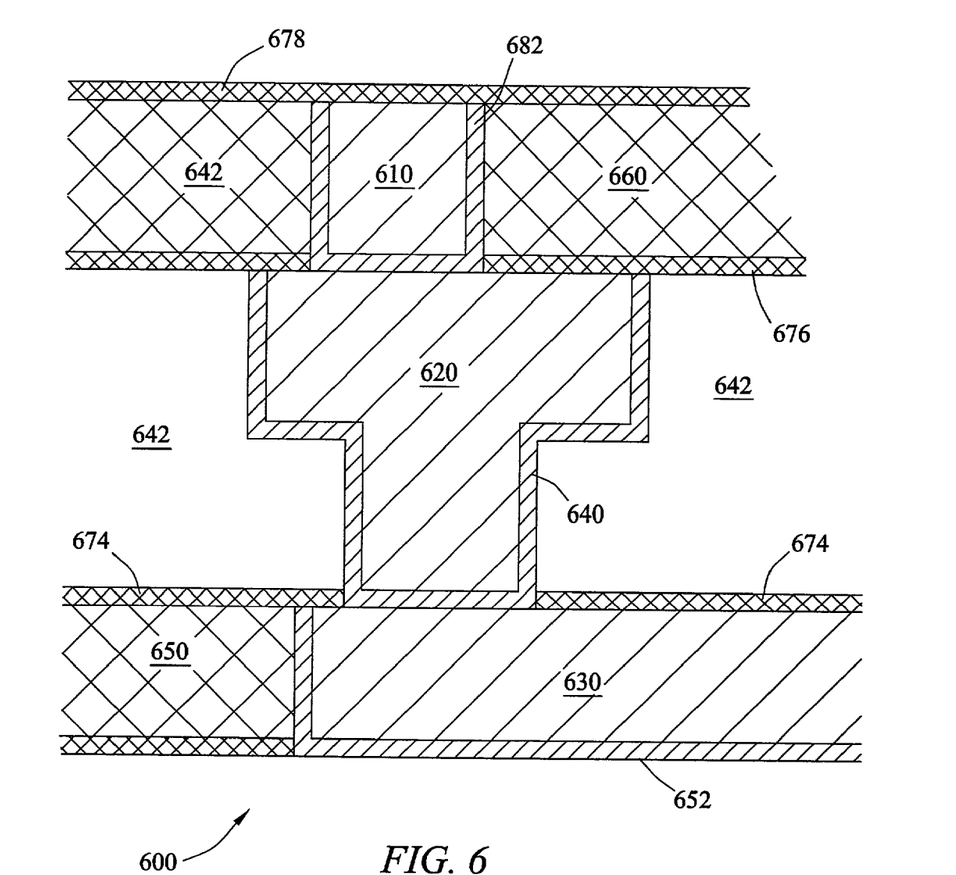
FIG. 6 is a schematic cross-sectional view representation of a portion of an integrated circuit, showing a ternary copper alloy interconnect in accordance with another exemplary embodiment.

FIG. 6 illustrates a schematic cross-sectional view representation of a dual damascene portion 600 of an integrated circuit, including a conductive layer 610, a via/trench section 620, a conductive layer 630, a barrier layer 640, a dielectric layer 650, and a dielectric layer 660. Portion 600 also includes a dielectric layer 642 that is separated from conductive layer 630 by an etch stop layer 644. Portion 600 is similar to portion 400 described with reference to FIG. 4 with the exception of via/trench section 620 having a shape of a wide interconnect, compared to shape of via/trench section 420 of narrow interconnect.

Dielectric layers can include low dielectric constant materials deposited by CVD or spin-on techniques. Low dielectric constant materials can have dielectric constant k=1.5-3.5 and can include porous materials with porosity between 10 and 45%. Pore size can have dimensions of 1-15 nm.

Dielectric layer 650 can be separated from copper layer 630 by a barrier layer 652. Similarly, dielectric layer 660 can be separated from copper via layer 610 by a barrier layer 682. Barrier layers 652 and 682 can be Tantalum Nitride (TaN). Etch stop layers 672, 674, 676, and 678 can be Silicon Nitride (SiN).

Figure 7:
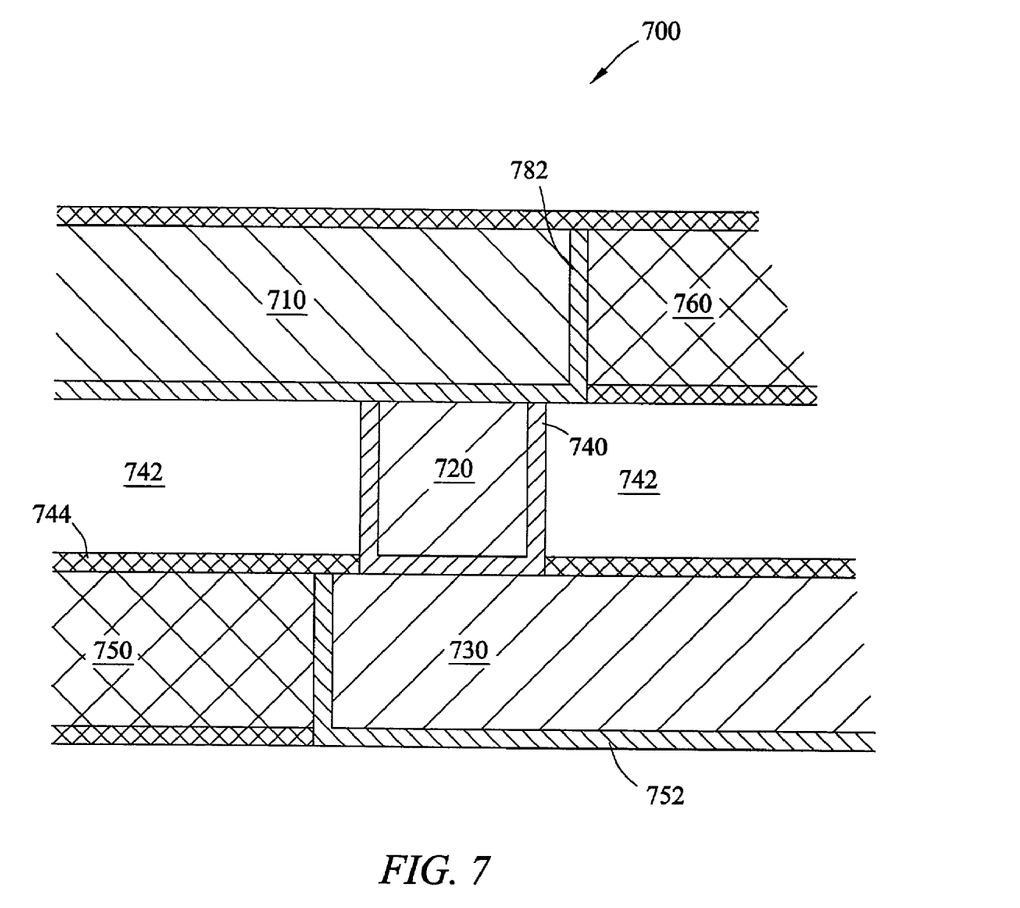
FIG. 7 is a schematic cross-sectional view representation of a portion of an integrated circuit, showing a ternary copper alloy interconnect in accordance with yet another exemplary embodiment.

FIG. 7 illustrates a schematic cross-sectional view representation of a single damascene portion 700 of an integrated circuit, including a conductive layer 710, a via section 720, a conductive layer 730, a barrier layer 740, a dielectric layer 750, and a dielectric layer 760. Portion 700 also includes a dielectric layer 742 that is separated from conductive layer 730 by an etch stop layer 744.

Advantageously, use of a ternary copper alloy in the formation of vias or interconnects can provide improved reliability and performance. For example, electromigration reliability can be improved due to stuffed grain boundaries. Further, electromigration is improved due to increased grain size.

While the exemplary embodiments illustrated in the figures and described above are presently preferred, it should be understood that these embodiments are offered by way of example only. Other embodiments may include, for example, different methods of implanting copper alloys and different elements into alloys. The invention is not limited to a particular embodiment, but extends to various modifications, combinations, and permutations that nevertheless fall within the scope and spirit of the appended claims.

What is claimed is:

1. A method of fabricating an integrated circuit, the method comprising:

depositing an etch stop layer over a first conductive layer, wherein the etch stop layer is in direct contact with the first conductive layer;

depositing an insulating layer after the etch stop layer is deposited over the etch stop layer;

forming a barrier layer extending along lateral side walls and a bottom of a via aperture, the via aperture being configured to receive a via material that electrically connects the first conductive layer and a second conductive layer; and depositing a copper alloy via material in the via aperture on the barrier layer to form a via, the copper alloy material including Zinc (Zn) or Silver (Ag) and at least one element for increasing grain size including Calcium (Ca) or Chromium (Cr), wherein the resistance of the via filled with the copper alloy via material is between 1.8 and 2.2 $\mu\Omega$cm less than the resistance of a via filled with copper, wherein depositing the copper alloy via material includes using an electroplating solution including organic additives to reduce voids in the via, wherein the organic additives are at least one of polypropylene glycols, polyethylene glycols and mercaptan disulfides.

2. The method of claim 1, wherein the copper alloy via material includes silver (Ag).

3. The method of claim 2, wherein the copper alloy via material includes Zinc (Zn).

4. The method of claim 1, wherein the copper alloy via material includes one atomic percent or less of Zinc (Zn) or Silver (Ag).

5. The method of claim 1, wherein the copper alloy via material includes Chromium (Cr).

6. The method of claim 5, wherein the element with a characteristic for increasing grain size is one atomic percent or less of Chromium (Cr).

7. The method of claim 5, wherein the increased grain size is between 0.5 and 3 µm.

8. A method of using ternary copper alloy to obtain a low resistance and large grain size interconnect or via, the method comprising:
providing a first conductive layer over an integrated circuit substrate;
providing an etch stop layer over the first conductive layer, wherein the etch stop layer is in direct contact with the first conductive layer;
providing an insulating layer over the etch stop layer after the etch stop layer has been provided over the first conductive layer;
providing a conformal layer section extending along a bottom and sides of a via aperture positioned over the first conductive layer to form a barrier separating the via aperture from the first conductive layer;
filling the via aperture with a ternary copper alloy via material to form a ternary copper alloy via on the conformal layer, the ternary copper alloy including at least one element for lowering resistivity and at least one of Chromium (Cr) or Calcium (Ca), wherein the ternary copper alloy via material includes an element with a characteristic for increasing grain size of the ternary copper alloy via, wherein the resistance of the ternary copper alloy via is between 1.8 and 2.2 µΩcm less than the resistance of a via filled with copper, wherein filling the via aperture includes using an electroplating solution including organic additives to reduce voids in the ternary copper alloy via, wherein the organic additives are at least one of polypropylene glycols, polyethylene glycols and mercaptan disulfides; and
providing a second conductive layer over the ternary copper alloy via such that the ternary copper alloy via electrically connects the first conductive layer to the second conductive layer.

9. The method of claim 8, wherein the ternary copper alloy via material is at least 98 atomic percent copper.

10. The method of claim 9, wherein the ternary copper alloy via includes Zinc (Zn), Silver (Ag), or Tin (Sn).

11. The method of claim 9, wherein the ternary copper alloy via includes one atomic percent or less of Chromium (Cr) or Calcium (Ca).

12. The method of claim 8, wherein the element with a characteristic for increasing grain size is Calcium (Ca) or Chromium (Cr).

13. The method of claim 8, wherein the element with a characteristic for increasing grain size is one atomic percent or less of the ternary copper alloy via material.

14. A method of forming a via in an integrated circuit, the method comprising:
depositing a first conductive layer;
depositing an etch stop layer over the first conductive layer, wherein the etch stop layer is in direct contact with the first conductive layer;
depositing an insulating layer over the etch stop layer;
forming an aperture in the insulating layer and the etch stop layer;
providing a barrier material extending along a bottom and sides of the aperture to form a barrier layer;
filling the aperture with a ternary copper alloy via material to form a ternary copper alloy via on the barrier material, the ternary copper alloy via including at least one of the following pairs of elements: Tin and Calcium; Tin and Chromium; Zinc and Chromium; Zinc and Calcium; Silver and Chromium; and Silver and Calcium, wherein the ternary copper alloy via material includes an element with a characteristic for increasing grain size of the ternary copper alloy via, wherein the resistance of the ternary copper alloy via is between 1.8 and 2.2 µΩcm less than the resistance of a via filled with copper, wherein filling the aperture includes using an electroplating solution including organic additives to reduce voids in the ternary copper alloy via, wherein the organic additives are at least one of polypropylene glycols, polyethylene glycols and mercaptan disulfides; and
providing a second conductive layer over the ternary copper alloy via such that the ternary copper alloy via electrically connects the first conductive layer and the second conductive layer.

15. The method of claim 14, wherein the ternary copper alloy via material includes copper (Cu), tin (Sn), and Calcium (Ca).

16. The method of claim 14, wherein the ternary copper alloy via material includes copper (Cu), zinc (Zn), and chromium (Cr).

17. The method of claim 14, wherein the ternary copper alloy is CuAgCr, or CuSnCa.

18. The method of claim 14, wherein the ternary copper alloy via includes stuffed grain boundaries.

19. The method of claim 14, wherein the grain size of the ternary copper alloy via is 0.5 to 3 µm.

* * * * *